United States Patent
Asao et al.

(10) Patent No.: US 10,793,182 B2
(45) Date of Patent: Oct. 6, 2020

(54) INTEGRATED ELECTRIC POWER STEERING APPARATUS

(71) Applicant: Mitsubishi Electric Corporation, Tokyo (JP)

(72) Inventors: Yoshihito Asao, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 575 days.

(21) Appl. No.: 15/544,033

(22) PCT Filed: Feb. 18, 2015

(86) PCT No.: PCT/JP2015/054413
§ 371 (c)(1),
(2) Date: Jul. 17, 2017

(87) PCT Pub. No.: WO2016/132474
PCT Pub. Date: Aug. 25, 2016

(65) Prior Publication Data
US 2017/0349206 A1 Dec. 7, 2017

(51) Int. Cl.
*B62D 5/04* (2006.01)
*H05K 7/20* (2006.01)
(Continued)

(52) U.S. Cl.
CPC .......... *B62D 5/0406* (2013.01); *H02K 5/04* (2013.01); *H02K 5/225* (2013.01); *H02K 9/22* (2013.01);
(Continued)

(58) Field of Classification Search
CPC ........ B62D 5/04; B62D 5/0406; H02K 11/33; H02K 11/30; H02K 5/04; H02K 5/225;
(Continued)

(56) References Cited

U.S. PATENT DOCUMENTS 9,270,145 B2 * 2/2016 Asao ............... H02K 1/185
9,570,960 B2 * 2/2017 Akutsu ............ H02K 5/04
(Continued)

FOREIGN PATENT DOCUMENTS

EP    2637285 A1    9/2013
EP    2808226 A1    12/2014
(Continued)

OTHER PUBLICATIONS

International Search Report of PCT/JP2015/054413 dated May 26, 2015.
(Continued)

*Primary Examiner* — Edgardo San Martin
(74) *Attorney, Agent, or Firm* — Sughrue Mion, PLLC; Richard C. Turner

(57) ABSTRACT

An integrated electric power steering apparatus in which a control unit 1 or 101 for controlling a motor 2 is disposed inside a housing, the control unit 1 or 101 is disposed so as to be coaxial to an output shaft 21 of the motor 2, and in which the control unit 1 or 101 and the motor 2 are integrated, wherein: the control unit 1 or 101 includes a circuit board 4 and an intermediate member 36; main parts are mounted to the circuit board 4; wiring is disposed on the intermediate member 36; the circuit board 4 and the intermediate member 36 are stacked; the parts are mounted to first and second surfaces of the circuit board 4; and a portion of the housing and first surfaces of the parts are placed in direct contact or are placed in contact so as to have a heat-transferring member interposed.

12 Claims, 4 Drawing Sheets

(51) Int. Cl.

| | | |
|---|---|---|
| *H02K 11/02* | (2016.01) | |
| *H02K 11/33* | (2016.01) | |
| *H02K 5/04* | (2006.01) | |
| *H02K 5/22* | (2006.01) | |
| *H02K 9/22* | (2006.01) | |
| *H05K 7/14* | (2006.01) | |
| *B62D 5/00* | (2006.01) | |
| *H02K 7/116* | (2006.01) | |
| *H02M 7/537* | (2006.01) | |
| *H02P 6/16* | (2016.01) | |

(52) U.S. Cl.
CPC ............. *H02K 11/02* (2013.01); *H02K 11/33* (2016.01); *H05K 7/1427* (2013.01); *H05K 7/20* (2013.01); *H02K 7/1166* (2013.01); *H02M 7/537* (2013.01); *H02P 6/16* (2013.01)

(58) Field of Classification Search
CPC .......... H02K 9/22; H05K 7/20; H05K 7/1427; H05K 7/1422; H05K 7/20154
See application file for complete search history.

(56) References Cited

U.S. PATENT DOCUMENTS

| | | | |
|---|---|---|---|
| 9,577,488 B2* | 2/2017 | Sonoda | H02K 5/225 |
| 9,586,615 B2* | 3/2017 | Asao | H02K 9/22 |
| 9,729,028 B2* | 8/2017 | Akutsu | B62D 5/0403 |
| 10,106,189 B2* | 10/2018 | Iwabuki | B62D 5/04 |
| 10,211,709 B2* | 2/2019 | Asao | B62D 5/0406 |
| 10,236,750 B2* | 3/2019 | Hirotani | H02K 11/022 |
| 10,285,286 B2* | 5/2019 | Asao | H05K 7/1432 |
| 2014/0239780 A1 | 8/2014 | Tanaka et al. | |
| 2014/0326530 A1 | 11/2014 | Asao et al. | |
| 2015/0216083 A1* | 7/2015 | Kanazawa | H02K 7/116 310/52 |
| 2017/0066470 A1* | 3/2017 | Asao | H02K 11/33 |
| 2018/0127020 A1* | 5/2018 | Asao | H02K 5/22 |
| 2019/0207488 A1* | 7/2019 | Ichikawa | H02K 5/10 |

FOREIGN PATENT DOCUMENTS

| | | |
|---|---|---|
| EP | 2808982 A1 | 12/2014 |
| JP | 2001-326306 A | 11/2001 |
| JP | 2007-237790 A | 9/2007 |
| JP | 2010-238690 A | 10/2010 |
| JP | 2011-23459 A | 2/2011 |
| JP | 4877265 B2 | 2/2012 |
| JP | 2012-135187 A | 7/2012 |
| JP | 2012-200070 A | 10/2012 |
| JP | 2012-210068 A | 10/2012 |
| JP | 2013-062923 A | 4/2013 |
| JP | 2013-147050 A | 8/2013 |
| JP | 2013-151206 A | 8/2013 |
| JP | 2014-043122 A | 3/2014 |

OTHER PUBLICATIONS

Communication dated Dec. 5, 2017 issued by the Japanese Patent Office in counterpart Japanese Application No. 2017-500190.
Communication dated Nov. 22, 2018 from the European Patent Office in application No. 15882577.8.

* cited by examiner

INTEGRATED ELECTRIC POWER STEERING APPARATUS

CROSS REFERENCE TO RELATED APPLICATIONS

This application is a National Stage of International Application No. PCT/JP2015/054413 filed Feb. 18, 2015, the contents of which are incorporated herein by reference in its entirety.

TECHNICAL FIELD

The present invention relates to an automotive electric power steering apparatus, and particularly relates to an apparatus in which a motor and a control unit are integrated coaxially on an output shaft of the motor.

BACKGROUND ART

In Patent Literature 1, in relation to an electric power steering apparatus that has a construction in which a motor and a control unit are integrated coaxially on a motor output shaft, a construction is disclosed in which a central processing unit (CPU), capacitors, and semiconductor switching elements are mounted onto a circuit board, and heat that is generated by the semiconductor switching elements is radiated to a heatsink through the circuit board.

CITATION LIST

Patent Literature

Patent Literature 1: Japanese Patent No. 4877265 (Specification)

SUMMARY OF THE INVENTION

Problem to be Solved by the Invention

In the construction that is disclosed in Patent Literature 1, there is still room for improvement in heat-radiating characteristics, and heat radiating not only from the semiconductor switching elements but also from the CPU, the capacitors, and elsewhere should also be taken into consideration, particularly heat generated by the motor due to reductions in size, and it has also been necessary to improve heat-radiating characteristics further depending on the overall location where the apparatus is mounted to a vehicle to enable further downsizing thereby.

The present invention aims to solve the above problems and an object of the present invention is to provide an integrated electric power steering apparatus that enables improvements in heat-radiating characteristics and reductions in size.

Means for Solving the Problem

In order to achieve the objective that is described above, in an integrated electric power steering apparatus in which a control unit for controlling a motor is disposed inside a housing, the control unit is disposed so as to be coaxial to an output shaft of the motor, and in which the control unit and the motor are integrated, according to the present invention: the control unit includes a circuit board and an intermediate member; main parts are mounted to the circuit board; wiring is disposed on the intermediate member; the circuit board and the intermediate member are stacked; the parts are mounted to first and second surfaces of the circuit board; and a portion of the housing and first surfaces of the parts are placed in direct contact or are placed in contact so as to have a heat-transferring member interposed.

Effects of the Invention

According to the present invention, because the first surfaces of the parts are placed in close contact with a heatsink, and second surfaces are also placed in contact with separate heat-radiating members, the heat-radiating characteristics of parts that generate a lot of heat in particular can be improved. Furthermore, because the main parts are mounted to a single circuit board, reductions in size are enabled.

DESCRIPTION OF EMBODIMENTS

Preferred embodiments of the present invention will now be explained with reference to the attached drawings. Moreover, in the figures, identical numbering indicates identical or corresponding portions.

Embodiment 1

Figure 1:
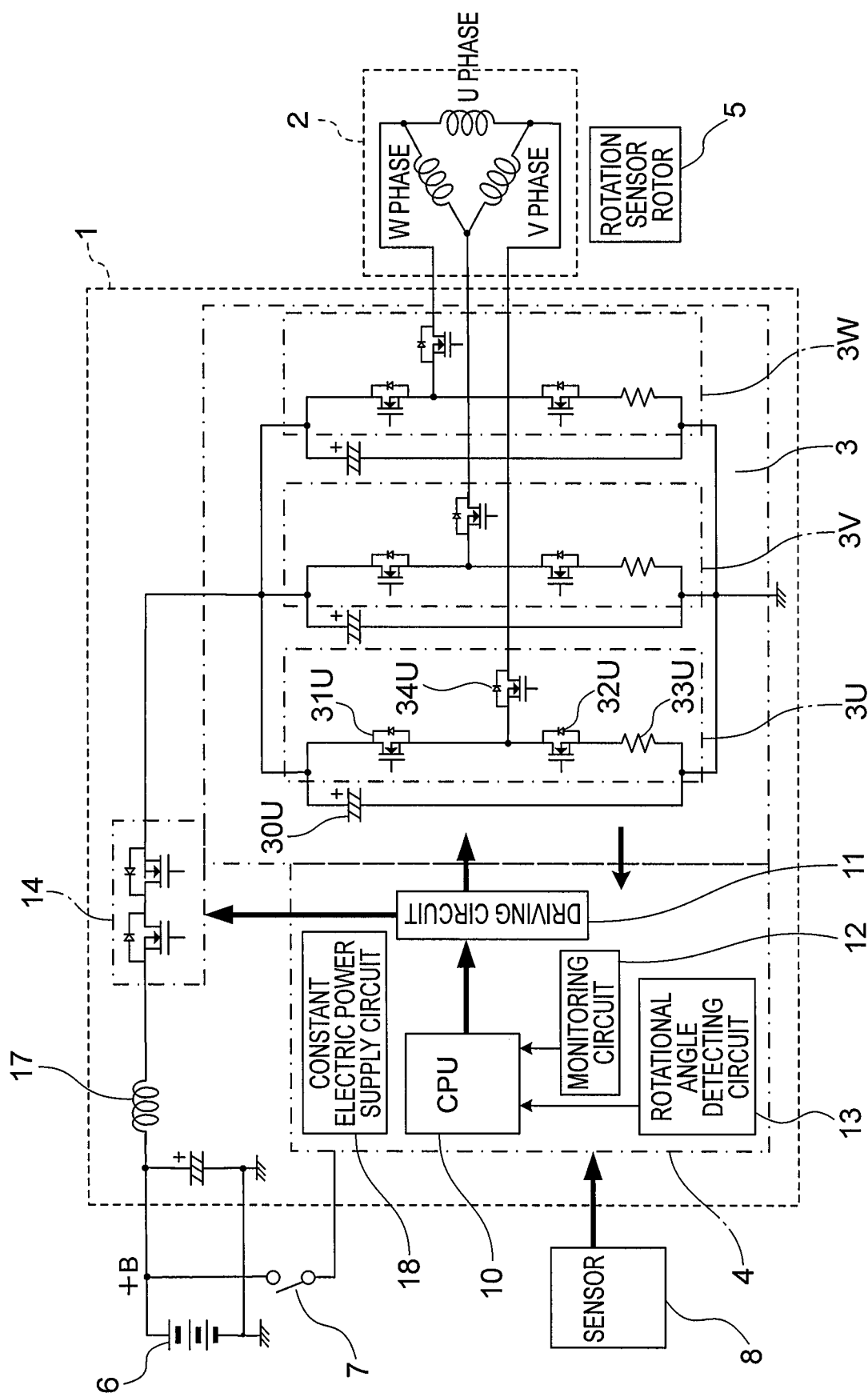
FIG. 1 is an overall circuit diagram for an integrated electric power steering apparatus.

FIG. 1 is an overall circuit diagram for an integrated electric power steering apparatus. The integrated electric power steering apparatus includes a control unit 1 and a motor 2. In this case, the motor 2 will be explained as a three-phase brushless motor, but the motor may have brushes, or may be a polyphase winding motor that has three or more phases.

A rotation sensor rotor 5 is disposed in a vicinity of an output shaft of the motor. The rotation sensor rotor 5 detects a motor rotational angle of the motor for the motor 2 (a brushless motor). The control unit 1 includes a circuit board 4. Mounted to the circuit board 4 are: a central processing unit (CPU) 10, various kinds of circuits, and an inverter circuit 3 that supplies electric current to the motor 2. A battery 6, an ignition switch 7, and sensors 8 that are mounted to a vehicle are also inputted into the integrated electric power steering apparatus.

The circuit board 4 inside the control unit 1 includes: the CPU 10; an initial stage driving circuit 11 for the inverter circuit 3, that functions as an output; a monitoring circuit 12; a rotational angle detecting circuit 13 for the rotation sensor; and a constant electric power supply circuit 18. The CPU 10 computes controlling variables that supply electric power to the motor 2 based on information from the sensors 8, such as a vehicle speed sensor, a torque sensor that detects steering torque on a steering wheel, etc. The monitoring circuit 12 detects the voltage or the electric current in each portion inside the inverter circuit 3.

A capacitor and a coil 17 are disposed in an electric power supply system (+B, ground) for noise reduction. Electric power supplying switching elements 14 that have a relay function that opens and closes a +B electric power supply line are also inserted into the electric power supply system (+B, ground). These switching elements are field-effect transistors (FETs), for example. A parasitic diode that is in a forward direction of the electric current supply and a parasitic diode that is in a reverse direction to the electric current supply are disposed in series. The electric power supply can be forcibly shut off by these switching elements if a failure arises in the inverter circuit 3 or the motor 2, for example. In addition, even if reverse connection of the battery is performed, the line through which the electric current flows will be shut off by the parasitic diodes, thereby also serving a role of battery reverse connection protection.

The inverter circuit 3 includes a configuration that has three switching elements (3U, 3V, and 3W), having an identical configuration to each of the phases of the three-phase (U, V, and W) winding of the motor 2. Explaining the U phase as a representative example, the U phase includes: two switching elements 31U and 32U that correspond to upper and lower arms; a capacitor 30U; a relay switching element 34U; and a shunt resistor 33U. The relay switching element 34U has a relay function that opens and closes between a motor winding (a stator winding) and the switching elements. Because the upper and lower arm switching elements 31U and 32U are driven using pulse-width modulation (PWM) based on commands from the CPU 10, they are connected to the capacitor 30U for purposes of noise suppression. The shunt resistor 33U is also connected to the upper and lower arm switching elements 31U and 32U in order to detect the electric current that flows to the motor 2. Parts other than the capacitor 30U are respectively mounted to the circuit board 4 on two surfaces of the circuit board. Moreover, numbering without "U" may be used instead of the numbering above to which "U" has been appended when describing all three phases, or may be used with "V" or with "W" appended instead of "U" to represent the respective other phases.

To summarize the functioning of the configuration that is shown in FIG. 1, the CPU 10 computes the electric current that is supplied to the winding of the motor 2 based on the inputted information from the sensors 8, and outputs it to the inverter circuit 3 by means of the driving circuit 11. The switching elements 31, 32, and 34 for each of the phases are thereby driven, and the electric current flows to the motor winding. The value of that supplied electric current is detected by the monitoring circuit 12, and feedback control is performed in response to deviation between the above computed value (a target value) from the CPU 10 and the actual current value. At the same time, the driving circuit 11 also controls the electric power supplying switching elements 14, and the CPU 10 also calculates the rotational position or the speed of the motor by means of the rotational angle detecting circuit 13 of the rotation sensor and uses it in that control.

Figure 2:
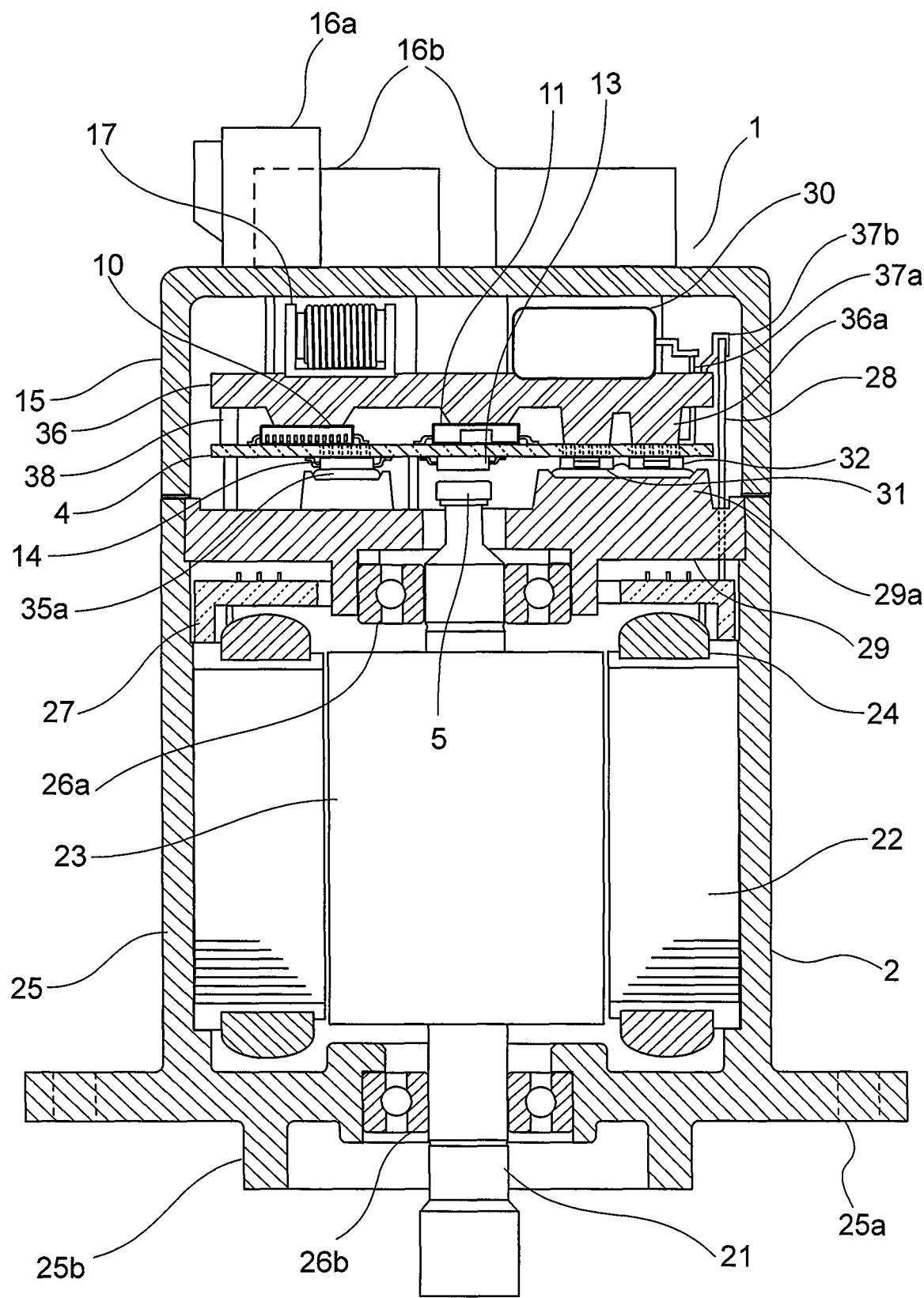
FIG. 2 is a diagram that shows a control unit and a motor integrated and partially in cross section.

Respective constructions will now be explained based on FIG. 2 in which the control unit 1 that has the above circuit and the motor 2 are integrated and a cross section is taken of a portion thereof. The motor 2 is toward the bottom in the figure, and the control unit 1 is disposed in an upper portion. The motor 2 is constructed so as to be mounted inside a motor case 25, and the motor case 25 is a metal member in which a mounting portion flange 25a and a connecting portion 25b that is connected to a reduction gear (not shown) are integrated. When consideration is given to heat-radiating characteristics and internal and external shapes, the motor case 25 should be made of aluminum, for example. A first bearing 26b is mounted to a lowest portion of a tube portion of the motor case 25, and an aperture through which an output shaft 21 of the motor can pass is opened centrally therethrough.

In a similar or identical manner to conventional apparatuses, the motor 2 includes: a rotor 23 in which permanent magnets are disposed in a plurality of pole pairs around the output shaft 21; and a stator 22 that is disposed so as to have a gap from the rotor 23 and onto which a winding 24 is mounted. The motor winding 24 is wound into three respective phases. An annular connecting ring 27 for connection is disposed immediately above the winding at an end portion of each of the phases. Winding end portions 28 of the three-phase winding each extend toward the control unit 1 (only one phase portion is depicted). The rotation sensor rotor 5 is mounted to a tip of a non-output end of the output shaft 21.

A frame 29 is mounted internally in an uppermost portion of the motor case 25 in a state of internal contact. This frame 29 is also made of a metal, a second bearing 26a is mounted centrally thereon, and an aperture through which the output shaft 21 passes is opened centrally therethrough. Apertures through which the winding end portions 28 can pass are also opened at three positions. In this manner, the frame 29 serves a plurality of roles such as providing a partitioning wall that separates the motor 2 and the control unit 1, providing a bearing holder, providing winding end portion penetrating apertures, etc. In addition, it also has a role as a heatsink for radiating heat from the control unit 1. Because the frame 29 is made to serve a large number of functions, the number of parts can be reduced. In the above manner, the motor 2 has a construction that is enveloped in the motor case 25 as far as the first and second bearings.

Next, the control unit 1 will be explained. The control unit 1 is mounted internally into a unit case 15 in which connectors 16a and 16b are disposed in an uppermost portion, and the unit case 15 is made of an insulating resin. The circuit board 4 and an intermediate member 36 are disposed inside the unit case 15. The control unit 1 has a two-tiered construction that includes the circuit board 4 and the intermediate member 36. Specifically, the circuit board 4 and the intermediate member 36 are stacked in a direction in which the output shaft of the motor extends, that is, up and down the page in FIG. 2. Some connecting pins (not shown) from the connectors 16a and 16b extend toward the intermediate member 36 and some toward the circuit board 4. The CPU 10 and the driving circuit 11 are mounted to an upper surface of the circuit board 4 in the figure, and power elements (switching elements) that constitute the inverter circuit 3 (nine in total, only 31 and 32 are shown), and the electric power supplying switching elements 14, etc., are disposed so as to be distributed on a lower surface thereof. Lower surfaces of the power elements (the switching elements) 31 and 32 are placed in close contact with protruding portions 29a that protrude outward from the frame 29 so as to have a heat-transferring member 35a interposed. The heat generated by the electric current that flows through the power elements is transferred to the frame 29 by means of this heat-transferring member 35a, and is radiated therefrom. It is desirable for the heat-transferring member 35a to be able to accommodate indentations and protrusions on the surfaces of the switching elements using a flexible material such as silicone resin, for example. Furthermore, forming perimeters of these protruding portions 29a into embankments helps position the heat-transferring member 35a and the switching elements. The frame 29 also serves a role as a cover for the control unit 1, and a surface of the frame 29 on a side near the control unit forms a housing. This frame 29 that constitutes the housing is also placed in close contact with the motor case 25, expanding heat transfer area, and forming a heatsink that contributes to improvements in heat-radiating characteristics.

In the present configuration, the unit case 15, the motor case 25, and the frame 29 constitute a housing, and the frame 29 and the unit case 15 constitute a unit cover. In other words, the frame 29 is a portion of the unit cover and also a portion of the housing. First surfaces of parts (described below) that are mounted to a first surface of the circuit board 4 are placed in contact with this frame 29 that is a portion of the housing. Furthermore, the intermediate member 36 (described below) is disposed on an opposite side of the circuit board 4 from the portion of the housing that is subjected to contact.

Busbars for electric power supply system lines 37a and wiring 37b are strung around the intermediate member 36, which is disposed in an uppermost layer of the circuit board 4. The capacitor 30 and the coil 17, which are large parts, are disposed in a space between the intermediate member 36 and the upper surface of the unit case 15, using the space effectively. Because it holds the various busbars, the intermediate member 36 is made of an insulating resin, a resin that has good thermal conduction being used. The intermediate member 36 has projecting portions 36a at several positions in particular, and at least these projecting portions 36a are made of a resin that has good thermal conduction. Lower ends of these projecting portions 36a are placed in close contact with parts that generate a lot of heat. They are placed in close contact with the CPU 10, with the driving circuit 11, and with the upper surface of the circuit board 4 at positions to which the power elements 31 and 32 are mounted, for example. Close contact with these projecting portions 36a distinctly improves heat-radiating characteristics compared to radiating heat into air when not placed in close contact. A large number of penetrating apertures are also open on the circuit board 4 to which the power elements 31 and 32 are mounted, thereby improving thermal conductivity.

A plurality of posts 38 extend from the intermediate member 36, serving roles of positioning and holding the circuit board 4, and posts 38 that extend further are fixed to the frame 29. Wiring terminals are also disposed on the intermediate member 36 in addition to the busbars, and are connected to the winding end portions 28 of the motor 2. These wiring terminals are connected to the power elements that are mounted to the lower surface of the circuit board 4. Electric power supply lines (+B, ground) for the power elements are also disposed in a similar manner, and a terminal of the capacitor 30 is also connected (welding) together with the +B line. Recess portions are disposed on an upper surface of the intermediate member 36 in order to position (three) capacitors 30 and the coil 17. If the intermediate member 36 is manufactured using a material that has good thermal conduction, then the contacting area is increased by the recess portions for the capacitors 30 and the coil 17, also contributing to heat radiation from these parts themselves.

In the above manner, the control unit 1 includes: an intermediate member 36 that is built into a unit case 15 that has connectors; and a circuit board 4 onto which main parts are mounted. Because the motor 2 is configured by mounting a frame 29, as mentioned above, and the two are in a partially completed state, the control unit 1 and the motor 2 can each be assembled separately, which has the merit that each can be checked separately before being subsequently integrated. The two can be integrated once problems have been cleared and an OK given, which can contribute as a countermeasure against failure during processing.

Figure 3:
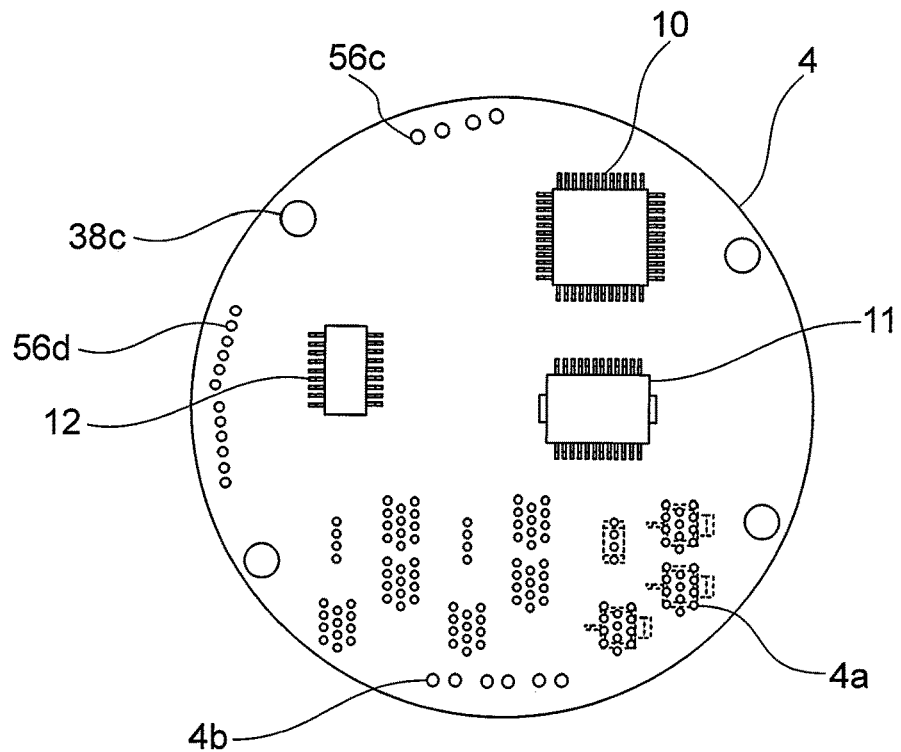
FIG. 3 is a top plan that shows a layout of main parts on a circuit board, particularly the control unit, viewed from a vicinity of connectors.

Next, arrangement of the main parts on the circuit board 4 will be explained. FIG. 3 is a top plan that shows a layout of the main parts on the circuit board 4, particularly the control unit 1, viewed from a vicinity of connectors 16. The circuit board 4 has a circular shape so as to conform with an external shape of the motor 2. The CPU 10, the driving circuit 11, and the monitoring circuit 12, etc., are mounted onto the upper surface of the circuit board 4. A large number of apertures are opened around the external shape, four apertures 56c being for electric power supply. Two apertures for +B and two apertures for ground are disposed so as to allow for electric current capacity thereof. Twelve apertures 56d are for information, including for the sensors 8. Four apertures 38c that have the largest diameters are apertures for the posts 38 for the circuit board to be supported. A large number of small-diameter apertures 4a are also opened on a lower side of the circuit board, and these are apertures that function as penetrating apertures that face the mounted positions of the switching elements and the shunt resistors, thermal conductivity being improved by these apertures and by soldering material inside the apertures. The projecting portions 36a of the intermediate member 36 in FIG. 2 extend toward these apertures. Moreover, the projecting portions 36a extend to locations that correspond to the mounted positions of the switching elements, but it is not necessary for them to extend to locations that correspond to the mounted positions of the shunt resistors, for example. In other words, this construction can be modified depending on the magnitude of the heat generated. In addition, six apertures 4b are opened in a lowermost portion in the figure, and these are for output ends of the inverter circuit for connection to motor winding ends (28 in FIG. 2).

Figure 4:
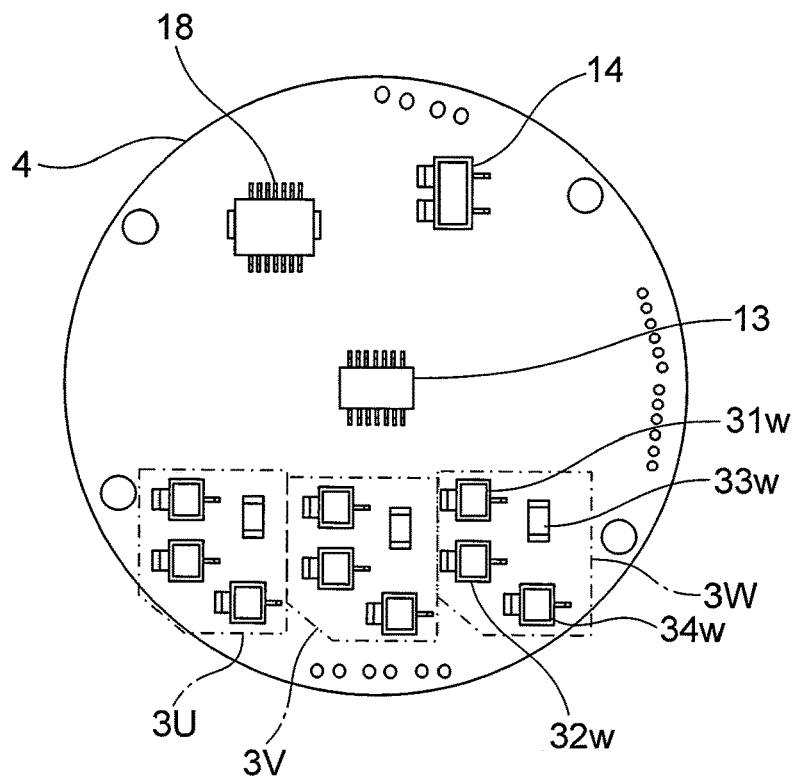
FIG. 4 is a diagram that shows a rear surface of the circuit board.

FIG. 4 shows a rear surface of the circuit board 4 (a surface on an opposite side from the surface that is shown in FIG. 3), and mounted thereto are: the constant power supply circuit 18, the electric power supplying switching elements 14, the rotational angle detecting circuit 13, and respective switching elements (31W, 32W, and 34W) and shunt resistors 33W, etc., that constitute part of the inverter circuit (3U, 3V, and 3W). The rotational angle detecting circuit 13 is disposed centrally on the circuit board in order to face the rotation sensor rotor 5 that is mounted to the tip of the output shaft (21 in FIG. 2). The constant electric power supply circuit 18 has a construction in which it is placed in contact only with a protruding portion 29a, and is not placed in contact with the projecting portions 36a of the intermediate member 36. The electric power supplying switching elements 14 and the switching elements (31W, 32W, and 34W) of the inverter circuit are FETs, for example, the electric power supplying switching elements 14 being formed into a single package in which two FETs are mounted internally and the rest of the FETs being separate elements. The inverter circuit is also disposed such that each phase is grouped together (3U, 3V, and 3W), and is connected to the output apertures 4b for connection to the motor winding terminals. Two output apertures 4b are used for each of the phases so as to allow for electric current capacity. In fact, the wiring pins that are inserted into these output apertures 4b extend out to the intermediate member 36, and tip portions thereof 37b and the motor winding ends are connected (by welding or crimping).

The switching elements of the inverter circuit are disposed so as to be gathered together on one portion of the circuit board 4, enabling the protruding portions 29a of the frame 29 and the projecting portions 36a of the intermediate member 36 that serve roles as radiating heatsinks to be aligned. Consideration has also been given such that the respective parts are arranged so as to be distributed over two surfaces of the circuit board 4 and do not overlap with each other. In the above manner, the circuit board 4 is a printed wiring board that has a construction that enables a wiring pattern among the respective parts to have a construction in which the parts are mounted on two surfaces, and to be disposed in multiple layers, enabling a large current to pass through the wiring pattern. Moreover, it is possible to make the FETs 31W and 32W that constitute the upper and lower arms of the switching elements of the inverter circuit into a single-package configuration, but if all three phases have a one- or two-package configuration, the packages themselves also become larger, and it is disadvantageous to gather together a large number of elements because heat-radiating characteristics may not be improved, hence making consolidation of two or three desirable. Furthermore, the inverter circuit is not limited to three phases as in FIG. 1 or FIG. 4, but may also be adapted to two three-phase systems, or to five phases or six phases.

In this manner, in the present Embodiment 1, a housing is made of a metal, and an intermediate member is disposed on an opposite side of a circuit board 4 from a portion of the housing. A control unit is disposed at an opposite end of a motor from an end of the motor at which an output shaft extends, and a portion of the housing is a portion of a frame that forms a boundary between the motor and the control unit. The connecting pins of at least one connector are connected directly to the circuit board, groups of parts that constitute a plurality of inverter circuits for driving the motor are mounted onto the circuit board so as to be consolidated into each phase of the motor winding, and penetrating apertures are disposed on the circuit board so as to correspond to the above-mentioned groups of parts. Parts are mounted to two surfaces of the circuit board, and a portion of the housing and first surfaces of the parts are placed in direct contact or are placed in contact so as to have a heat-transferring member interposed.

By arranging heat-generating parts so as to be distributed according to position on the circuit of the apparatus and according to external shape, and particularly disposing together parts that have identical shapes and that are positioned in proximity on the circuit, and more particularly disposing parts that generate a lot of heat as separately as possible in the above manner, a heatsink such as the frame 29 (the housing), for example, and the intermediate member 36 can be placed in close contact with each other. Furthermore, depending on the amount of heat generated in the parts, it is also possible to select double-surface heat radiation or single-surface heat radiation. Using a single circuit board configuration in this manner, reductions in size can be achieved. Furthermore, reductions in size can be contributed to, due to the intermediate member 36 serving a large number of roles such as holding wiring portions such as busbars, etc., supporting heat-conducting portions and the circuit board, and positioning large parts, etc.

Embodiment 2

Figure 5:
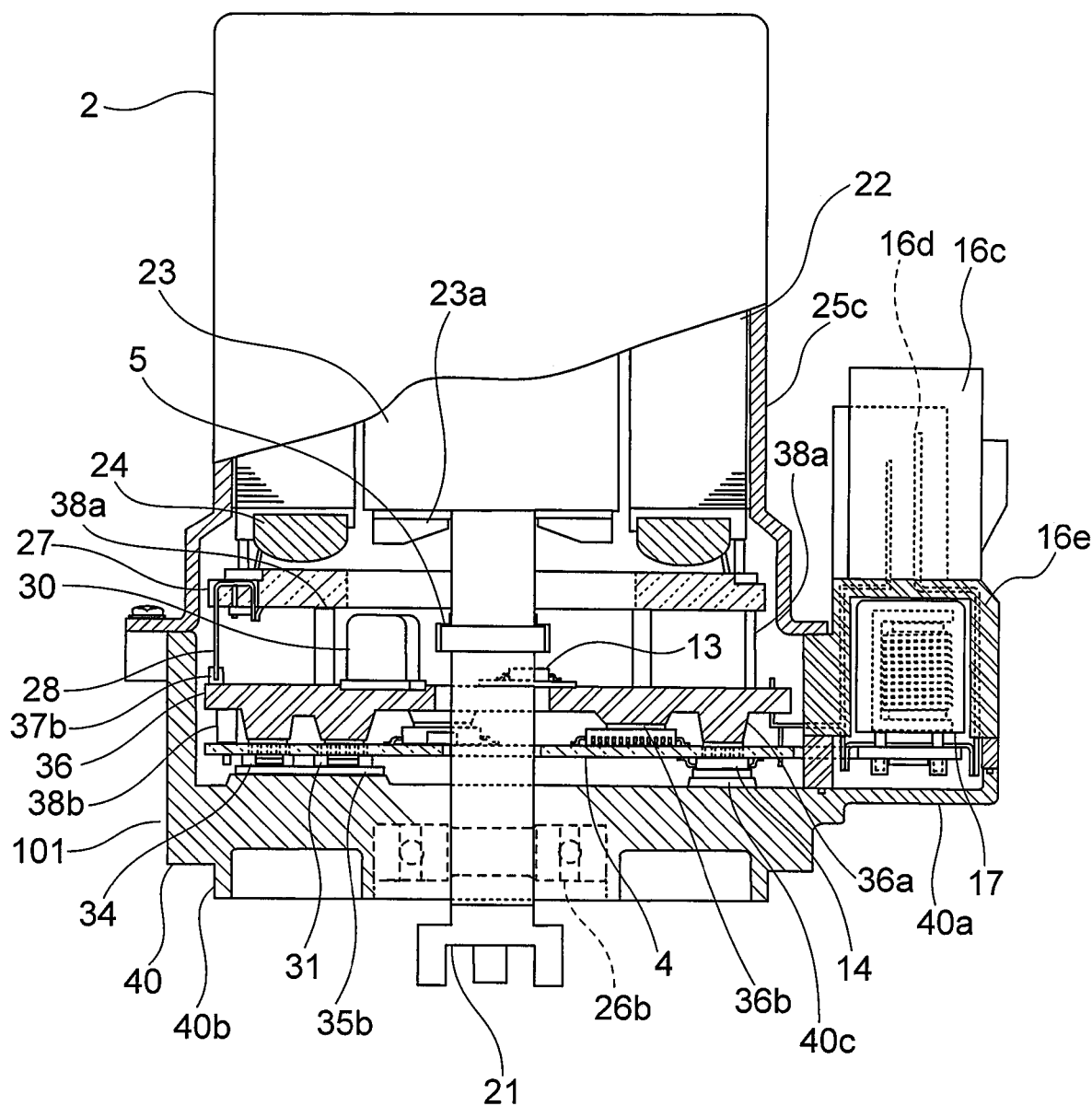
FIG. 5 is a diagram that relates to Embodiment 2 of the present invention, and has similar features to FIG. 2.

Next, Embodiment 2 according to the present invention will be explained. FIG. 5 is a diagram that relates to Embodiment 2 according to the present invention, and has similar features to FIG. 2. Moreover, the rest of the configuration, other than the portions that are explained below, is similar or identical to Embodiment 1 that is described above.

Configuration of a motor 2 is similar to that of Embodiment 1, and is constituted by: an output shaft 21, a rotor 23, a stator 22, a winding 24, an annular connecting ring 27, and winding end portions 28 in a motor case 25c. Because the motor 2 is formed by assembling each of the above portions, it is similar to Embodiment 1 above in that the motor 2 itself can be checked in this state.

A control unit 101 is disposed in a direction of extension of the output shaft 21 of the above-mentioned motor 2, and the output shaft 21 passes through at a central portion of the control unit 101. A perimeter portion 40a projects out from a portion of a unit case 40 of the control unit 101 further than an outside diameter of the motor 2. Connectors 16d and 16c are mounted to an upper portion of this perimeter portion 40a in the figure, and there is a connector extending portion 16e between the connectors 16c and 16d and the perimeter portion 40a. A coil 17 is mounted internally, and electric power supply system lines and sensor signal pins also extend inside this connector extending portion 16e. The connectors 16c and 16d and the connector extending portion 16e are made of an insulating resin. An intermediate member 36 and a circuit board 4 are mounted internally into an internal space of the unit case 40. The intermediate member 36 is disposed near the motor 2, and the circuit board 4 is disposed on an axially outer end in an output shaft direction.

Capacitors 30 are disposed in a space between the intermediate member 36 and the annular connecting ring 27, these capacitors being microminiature parts, and unlike Embodiment 1, are placed lengthwise in an identical direction to the output shaft 21. Because heights of the capacitors 30 are reduced, a height of this space is also reduced. Because of that, length in the direction of the output shaft can be reduced. In addition, because the coil 17 cannot be disposed in this space, and also because it is positioned in a remote portion of the circuit, the coil 17 is disposed in the connector extending portion 16e.

The electric power supply system lines are led into the intermediate member 36 via the connector 16c and the coil 17, and wiring from the connector 16d is connected to the circuit board 4. Apertures 38c and 38b extend in two directions on the intermediate member 36 in order to support the annular connecting ring 27, and to support the circuit board 4. An aperture through which the output shaft 21 can pass is opened through a central portion of the intermediate member 36. A rotation sensor rotor 5 is also mounted to that output shaft 21, a rotational angle detecting circuit 13 for detecting rotation thereof is disposed in a vicinity of a central aperture on the circuit board, an electric power supplying line to the circuit and the output line from the circuit are also disposed on the intermediate member 36, and are connected to the CPU 10 on the circuit board 4. A plurality of projecting portions 36a are also disposed, and are placed in contact with the circuit board 4, or with parts thereon, and heat-transferring members may be disposed on contacting portions 36b, or members that transfer heat better than the main body of the intermediate member 36 can also be disposed. Furthermore, depending on the surface material of the contacting counterpart, a construction can also be adopted in which a metal sheet is fitted between the contacting counterpart and the projecting portions 36a.

The CPU 10 and a driving circuit 11 are mounted to an upper side of the circuit board 4 in the figure (a non-output shaft direction), and FETs that constitute various kinds of switching elements are mounted to a lower side (an output shaft direction). The projecting portions 36a of the intermediate member 36 and protruding portions 40c of the unit case 40 are placed in close contact with heat-generating parts in a similar or identical manner to Embodiment 1. The protruding portions 40c of the unit case 40 form a construction that protrudes outward so as to face the switching elements in a similar or identical manner to Embodiment 1, and a heat-transferring member 35b (in sheet form) that has elasticity is interposed between the protruding portions 40c and the switching elements. The circuit board 4 may have a shape that extends to the right in the figure, and in that case, the connecting pins of the connectors 16c may be extended to this extended portion and connected to the circuit board directly. The unit case 40 also has a connecting portion 40b to a reduction gear (not shown) and a holding portion for a bearing 26b. For that reason, the unit case 40 is made of a metal, and is made of aluminum so as to allow for heat-radiating characteristics and workability. Consequently, an external shape of the control unit 101 is constituted by the metal unit case 40 and the connectors and resin portions of the connector extending portion. Because it has the above construction, the unit case 40 serves the role of the cover of the control unit, and can also be called a housing.

In the unit case 40 (the housing), because heat from the protruding portions 40c is transferred, and is eventually radiated to the outer circumference and to the reduction gear (not shown), a wider heat-radiating area is ensured, thereby leading to improvements in heat-radiating characteristics. A portion of the heat is also transferred via the projecting portions 36a of the intermediate member 36, constituting double-sided heat radiation depending on the parts.

Moreover, the heat-radiating construction is such that the CPU 10 and the driving circuit 11, etc., are placed in contact with only the projecting portions 36a of the intermediate member 36, but the CPU 10 may be mounted to the rear surface, for example, and heat radiated using the protruding portions 40c of the unit case 40. In other words, the configuration is such that parts are divided into at least three groups: parts that generate a lot of heat; parts that generate little heat; and parts that naturally radiate sufficient heat, and the parts that generate a lot of heat are contacted from two surfaces, the parts that generate little heat are contacted from one surface, and the naturally heat-radiating parts are not placed in contact with anything. Furthermore, the parts that generate little heat are made to radiate heat using either one of the projecting portions 36a and the protruding portions (29a and 40c), and if natural heat radiation only by penetrating apertures is added, the parts can be divided into five or more groups in total.

Because the rotor 23 of the motor 2 rotates, the motor 2, particularly the stator winding 24 and also the control unit part, can be air-cooled by disposing a plurality of fins 23a on an end portion of the rotor 23 that is near the control unit, and using these fins to generate an airflow. By designing fin shape and fin angle so as to allow for repeated normal rotation and reverse rotation, the rotor in the present apparatus can also be designed to increase airflow toward the control unit whichever way it is rotating, for example, or to change wind direction during normal rotation and during reverse rotation.

In Embodiment 2, a control unit is disposed in a motor on an identical side to which an output shaft of the motor extends, and a portion of the housing is a portion of a unit case that is joined to a reduction gear upon which output from the motor acts. Furthermore, an intermediate member, a circuit board, and the unit case are stacked so as to line up in order of closeness to the motor, the unit case is made of a metal, and a portion of an outer circumference of the unit case is cut away, and connectors are mounted.

Because mounting of parts to the circuit board inside the control unit 101, and heat-radiating constructions are improved, and respective spaces are also used effectively, in the above manner, length of the entire apparatus, particularly in the direction of the output shaft, can be shortened, enabling reductions in size. Because heat transfer from protruding portions can contribute to heat transfer area together with other portions that are in close contact therewith, heat-radiating characteristics are improved. Furthermore, the motor 2 and the control unit 1 are respectively assembled as semi-finished parts, which has a merit in work flow of enabling checks to be performed on each before integrating the two.

Finally, the contents of the present invention have been explained in detail with reference to preferred embodiments, but it is self-evident that various modified configurations can be adopted by any person skilled in the art based on the basic technical concepts and teachings of the present invention.

The present invention includes configurational features as follows. Specifically, the present invention includes a configuration in which a circuit board 4 and a housing (at least one of a unit case 15, a motor case 25, and a frame 29, or a unit case 40, a motor case 25c, and an annular connecting ring 27, for example) are placed in direct contact or are placed in contact so as to have a heat-transferring member interposed. The present invention also includes a configuration in which the circuit board 4 and an intermediate member 36 are placed in direct contact or are placed in contact so as to have a heat-transferring member interposed. The present invention also includes a configuration in which parts, i.e., parts that are mounted to a front surface or a rear surface of the circuit board 4 (at least one of a CPU 10, a driving circuit 11, a monitoring circuit 12, a rotational angle detecting circuit 13, a constant electric power supply circuit 18, switching elements 14, or power elements 31 and 32, for example) and a housing (at least one of a unit case 15, a motor case 25, and a frame 29, or a unit case 40, a motor case 25c, and an annular connecting ring 27, for example) are placed in direct contact or are placed in contact so as to have a heat-transferring member interposed. In addition, the present invention includes a configuration in which parts (at least one of a CPU 10, a driving circuit 11, a monitoring circuit 12, a rotational angle detecting circuit 13, a constant electric power supply circuit 18, switching elements 14, or power elements 31 and 32, for example) and the intermediate member 36 are placed in direct contact or are placed in contact so as to have a heat-transferring member interposed.

EXPLANATION OF NUMBERING

1 CONTROL UNIT, 2 MOTOR, 3 INVERTER CIRCUIT, 4 CIRCUIT BOARD, 14 ELECTRIC POWER SUPPLYING SWITCHING ELEMENT, 15 UNIT CASE, 16 CONNECTOR, 21 OUTPUT SHAFT, 29 FRAME, 36 INTERMEDIATE MEMBER, 36a PROJECTING PORTION, 37b WIRING, 40 UNIT CASE, 101 CONTROL UNIT.

The invention claimed is:
1. An integrated electric power steering apparatus in which a control unit for controlling a motor is disposed inside a housing, said control unit is disposed so as to be coaxial to an output shaft of said motor, and in which said control unit and said motor are integrated, wherein:

said control unit includes a circuit board and an intermediate member;
main parts are mounted to said circuit board;
wiring is disposed on said intermediate member;
said circuit board and said intermediate member are stacked;
said parts are mounted to first and second surfaces of said circuit board; and
a portion of said housing and first surfaces of said parts disposed on the second surface of said circuit board are placed in direct contact or are placed in contact so as to have a heat-transferring member interposed,
wherein the second surface of said circuit board faces the motor.

2. The integrated electric power steering apparatus according to claim 1, wherein:
said intermediate member comprises a plurality of busbars for wiring;
a surface of said intermediate member that faces said circuit board comprises a projecting portion; and
said projecting portion is placed in contact with said parts or said circuit board.

3. The integrated electric power steering apparatus according to claim 1, wherein:
said housing is made of a metal; and
said intermediate member is disposed on an opposite side of said circuit board from said portion of said housing.

4. The integrated electric power steering apparatus according to claim 1, wherein:
said control unit is disposed at an opposite end of said motor from an output shaft of said motor; and
said portion of said housing is a portion of a frame that forms a boundary between said motor and said control unit.

5. The integrated electric power steering apparatus according to claim 1, wherein:
said control unit is disposed at an identical end of said motor to an output shaft of said motor; and
said portion of said housing is a portion of a unit case that is joined to a reduction gear upon which output from said motor acts.

6. The integrated electric power steering apparatus according to claim 4, wherein parts that generate heat among said parts include at least parts that are placed in contact with said housing and parts that are placed in contact with said intermediate member.

7. The integrated electric power steering apparatus according to claim 6, wherein:
said parts that are mounted to said first surface of said circuit board include switching elements, said switching elements being placed in direct contact with said portion of said housing or being placed in contact therewith by means of heat-transferring members; and
said parts that are mounted to said second surface of said circuit board are placed in direct contact with said intermediate member or are placed in contact therewith by means of heat-transferring members.

8. The integrated electric power steering apparatus according to claim 4, wherein:
said circuit board, said intermediate member, and a unit case with connector are stacked side by side in order of closeness to said motor; and
said unit case with connector and said intermediate member are made of an insulating resin.

9. The integrated electric power steering apparatus according to claim 5, wherein:
said intermediate member, said circuit board, and said unit case are stacked side by side in order of closeness to said motor;
said unit case is made of a metal; and
a portion of an outer circumference of said unit case is cut away and a connector is mounted thereto.

10. The integrated electric power steering apparatus according to claim 9, wherein at least one connecting pin of said connector is connected directly to said circuit board.

11. The integrated electric power steering apparatus according to claim 1, wherein a plurality of groups of parts that constitute an inverter circuit for driving said motor are mounted so as to be consolidated into each phase of a winding of said motor on said circuit board.

12. The integrated electric power steering apparatus according to claim 11, wherein penetrating apertures are disposed on said circuit board so as to correspond to said groups of parts.

* * * * *